(12) United States Patent
Takamoto

(10) Patent No.: US 7,829,441 B2
(45) Date of Patent: Nov. 9, 2010

(54) THERMOSETTING DIE-BONDING FILM

(75) Inventor: Naohide Takamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/529,211

(22) PCT Filed: Feb. 4, 2008

(86) PCT No.: PCT/JP2008/051772

§ 371 (c)(1),
(2), (4) Date: Aug. 31, 2009

(87) PCT Pub. No.: WO2008/108131

PCT Pub. Date: Sep. 12, 2008

(65) Prior Publication Data

US 2010/0081258 A1 Apr. 1, 2010

(30) Foreign Application Priority Data

Mar. 1, 2007 (JP) .............................. 2007-051767

(51) Int. Cl.
*H01L 21/00* (2006.01)
(52) U.S. Cl. .................... 438/464; 428/343; 525/50; 525/55; 525/523; 525/390; 257/E21.599
(58) Field of Classification Search ........................ None
See application file for complete search history.

(56) References Cited

U.S. PATENT DOCUMENTS

| 6,323,251 | B1 * | 11/2001 | Perez et al. .................. 521/134 |
| 2007/0003758 | A1 * | 1/2007 | Jin .............................. 428/343 |
| 2009/0032976 | A1 | 2/2009 | Misumi et al. |

FOREIGN PATENT DOCUMENTS

| JP | 60-057342 | 4/1985 |
| JP | 2005-120269 | 5/2005 |
| JP | 2006-261657 | 9/2006 |
| JP | 2006-299226 | 11/2006 |

OTHER PUBLICATIONS

International Search Report issued on the corresponding PCT Application No. PCT/JP2008/051772, dated Feb. 26, 2008.

* cited by examiner

*Primary Examiner*—Charles D Garber
*Assistant Examiner*—Yasser A Abdelaziez
(74) *Attorney, Agent, or Firm*—Knobbe Martens Olson & Bear LLP

(57) ABSTRACT

A thermosetting die-bonding film having excellent adhesion to an adherent and preferable pickup properties and a dicing die-bonding film having the thermosetting die-bonding film are provided. The thermosetting die-bonding film of the present invention is a thermosetting die-bonding film that is used when manufacturing a semiconductor device and contains 15 to 30% by weight of a thermoplastic resin component and 60 to 70% by weight of a thermosetting resin component as main components, wherein a surface free energy before heat curing is 37 mJ/m² or more and less than 40 mJ/m².

13 Claims, 3 Drawing Sheets

THERMOSETTING DIE-BONDING FILM

This application is the U.S. National Phase under 35 U.S.C. §371 of International Application No. PCT/JP2008/051772, filed Feb. 4, 2008, which claims priority to the Japanese Patent Application No. 2007-051767, filed Mar. 1, 2007. The International Application was not published in English under PCT Article 21(2).

TECHNICAL FIELD

The present invention relates to a thermosetting die-bonding film and a dicing die-bonding film having the thermosetting die-bonding film, and more specifically relates a thermosetting die-bonding film that is used when die bonding a semiconductor chip etc. onto an adherent such as a substrate and a lead frame, and a dicing die-bonding film having the thermosetting die-bonding film.

BACKGROUND ART

Conventionally, silver paste has been used to bond a semiconductor chip to a lead frame or an electrode member in the step of producing a semiconductor device. The treatment for the sticking is conducted by coating a paste-form adhesive on a die pad of a lead frame, or the like, mounting a semiconductor chip on the die pad, and then setting the paste-form adhesive layer.

However, about the paste-form adhesive, the amount of the coated adhesive, the shape of the coated adhesive, and on the like are largely varied in accordance with the viscosity behavior thereof, a deterioration thereof, and on the like. As a result, the thickness of the formed paste-form adhesive layer becomes uneven so that the reliability in strength of bonding a semiconductor chip is poor. In other words, if the amount of the paste-form adhesive coated on an electrode member is insufficient, the bonding strength between the electrode member and a semiconductor chip becomes low so that in a subsequent wire bonding step, the semiconductor chip is peeled. On the other hand, if the amount of the coated paste-form adhesive is too large, this adhesive flows out to stretch over the semiconductor chip so that the characteristic becomes poor. Thus, the yield or the reliability lowers. Such problems about the adhesion treatment become particularly remarkable with an increase in the size of semiconductor chips. It is therefore necessary to control the amount of the coated paste form adhesive frequently. Thus, the workability or the productivity is deteriorated.

In this coating step of a paste-form adhesive, there is a method of coating the adhesive onto a lead frame or a forming chip by an independent operation. In this method, however, it is difficult to make the paste-form adhesive layer even. Moreover, an especial machine or a long time is required to coat the paste-form adhesive. Thus, a dicing die-bonding film which makes a semiconductor wafer to be bonded and held in a dicing step and further gives an adhesive layer, for bonding a chip, which is necessary for a mounting step is disclosed (see, for example, JP-A-60-57342).

This dicing die-bonding film has a structure wherein a adhesive layer and an adhesive layer are successively laminated on a supporting substrate. That is, a semiconductor wafer is diced in the state that the wafer is held on the adhesive layer, and then the supporting substrate is extended; the chipped works are peeled together with the adhesive layer; the peeled works are individually collected; and further the chipped works are bonded onto an adherend such as a lead frame through the adhesive layer.

In the meantime, an adhesive film for die bonding, which is used to bond a semiconductor chip, is, for example, a thermosetting film. As this thermosetting die bonding film, an adhesive film having a low melt viscosity is used in order to improve the adhesiveness of the film onto an adherend having largely differential levels on the basis of irregularity of its surface, typical examples of the adherend including a board having wiring thereon, and a semiconductor chip having wires thereon.

However, if the melt viscosity is too low, an adhesive bleeds out from the adhesive film to result in a problem that the adhesive pollutes the substrate or the semiconductor chip. On the other hand, if the melt viscosity is too high, the adhesiveness of the film onto an adherend deteriorates to result in a problem that voids are generated.

There is often a case that the die-bonding film of a dicing die-bonding film of this type is formed on the entire surface of an adhesive layer (an adhesive film) due to limitation of its manufacturing step. However, in such case, there has been a case that the dicing ring is contaminated because the dicing ring is adhered to the die-bonding film. On the other hand, a method in which the die-bonding film is formed into the same shape as a shape of a work piece on the pressure-sensitive adhesive layer by matching the shape of the work piece. However, in such a case, there is a case that air bubbles (voids) are generated between the die-bonding film and the chip and between the die-bonding film and the adherent during die bonding. As a result, it becomes a cause of generating troubles in a produced semiconductor device.

Therefore, a dicing die-bonding film having a die-bonding film having a high surface free energy has been used in order to improve adhesion (embedding properties) into the adherent during die bonding. However, because the surface free energy is high, the adhesion with the dicing film is improved, and thus, the die-bonding film and the dicing film cannot be peeled in the pickup step, and there is a problem that the pickup cannot be performed.

Patent Document 1 Japanese Patent Application Laid-Open No. 60-57342

DISCLOSURE OF THE INVENTION

Problems to be Solved by the Invention

The present invention is performed in view of the above-described problem points, and an object thereof is to provide a thermosetting die-bonding film that is excellent in adhesion with an adherent and that has preferable pickup properties, and a dicing die-bonding film having the thermosetting die-bonding film.

Means for Solving the Problems

In order to solve the above-mentioned problems, the present inventors have made eager investigations on a thermosetting die bonding film, and a dicing die-bonding film having the same. As a result, the inventors find out that the above-mentioned object can be attained by adopting a configuration that will be described below, to complete the invention.

That is, the present invention relates to a thermosetting die-bonding film used when manufacturing a semiconductor device, comprising 15 to 30% by weight of a thermoplastic resin component and 60 to 70% by weight of a thermosetting resin component as main components, wherein a surface free energy before heat curing is 37 $mJ/m^2$ or more and less than 40 $mJ/m^2$.

According to the above-described configuration, because the surface free energy of the above-described die-bonding film before heat curing is set to 37 mJ/m² or more by setting the lower limit of a thermoplastic resin component to 15% by weight and the upper limit of a thermosetting resin component to 70% by weight, the adhesion of a substrate, etc. to the adherent is made to be preferable. As a result, the generation of voids can be decreased on the adhesion surface of the substrate, the lead frame, etc. with the adherent. On the other hand, because the above-described surface free energy is made to be less than 40 mJ/m² by setting the upper limit of the thermoplastic resin component to 30% by weight and the lower limit of a thermosetting resin component to 60% by weight, in the case of a dicing die-bonding film in which the die-bonding film in the present invention is laminated with a dicing film, for example, peeling properties of the die-bonding film to the die-bonding film are made to be preferable. As a result, the pickup properties during the pickup step are improved, and a yield of the semiconductor device manufacturing can be improved.

The tensile storage modulus of the die bonding film is preferably 10 MPa or more at 250° C. after the film is thermally set. Thus, even when performing wire bonding to a semiconductor chip that is fixed onto the thermosetting die-bonding film, for example, generation of shear deformation due to ultrasonic vibration or heating is prevented in the adhesion surface of the die-bonding film with the adherent. As a result, a success rate of wire bonding is improved, and it becomes possible to manufacture a semiconductor device with further improved yield.

It is preferred that a glass transition point of the die-bonding film after heat curing is 175° C. or more. Thus, for example, the semiconductor element is prevented from inclining in the sealing step, and generation of peeling can be prevented between the die-bonding film and the adherent during a solder reflow step.

It is preferred that a coefficient of water absorption after heat curing by heating when left in an atmosphere at 85° C. and 85% RH for 168 hours is 1% by weight or less. By setting a coefficient of water absorption to 1% by weight or less, generation of voids can be prevented in the reflow step, for example.

It is preferred that a weight reduction ratio of 1% by weight or less after the film is heated at 250° C. for 1 hour after heated so as to be thermally set. By setting a weight loss amount to 1% by weight or less, generation of cracks can be prevented in a package in the reflow step, for example.

The dicing die-bonding film according to the invention is characterized in that the above-mentioned thermosetting die bonding film is laminated on a pressure-sensitive adhesive film in order to solve the above-mentioned problems.

EFFECT OF THE INVENTION

The present invention has an effect described below by the means explained above.

That is, according to the present invention, by containing 15 to 30% by weight of a thermoplastic resin component and 60 to 70% by weight of a thermosetting resin component as main components and setting a surface free energy before heat curing to 37 mJ/m² or more and less than 40 mJ/m², adhesion to the adherent is improved and the generation of voids in prevented, and the pickup properties during the pickup step are made to be preferable. As a result, it becomes possible to manufacture a semiconductor device having high reliability with preferable yield.

DESCRIPTION OF THE REFERENCE NUMERALS

| | |
|---|---|
| 3a | Die-Bonding Film (Thermosetting Die-Bonding Film) |
| 5 | Semiconductor Chip (Semiconductor Element) |
| 6 | Substrate, etc (Adherent) |
| 7 | Bonding wire |
| 8 | Sealing Resin |
| 9 | Spacer |
| 10, 11 | Dicing Die-Bonding Film |
| 13 | Die-Bonding Film (Thermosetting Die-Bonding Film) |
| 15 | Semiconductor Chip (Semiconductor Element) |
| 21 | Die-Bonding Film (Thermosetting Die-Bonding Film) |

BEST MODE FOR CARRYING OUT THE INVENTION

Dicing Die Bond Film

Figure 1:
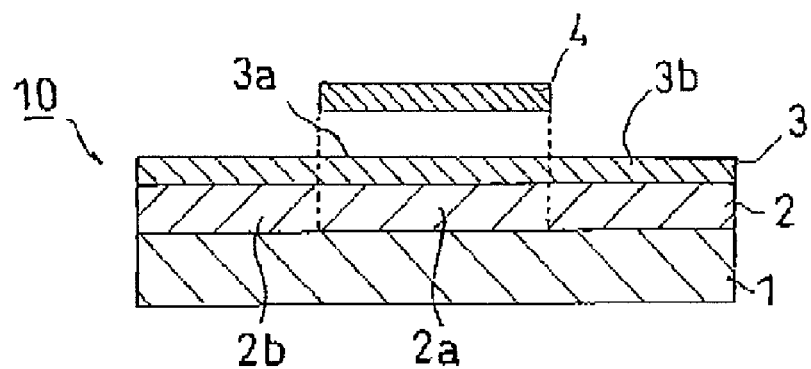
FIG. 1 is a cross-sectional schematic drawing showing a dicing die-bonding film according to one embodiment of the present invention.
Figure 2:
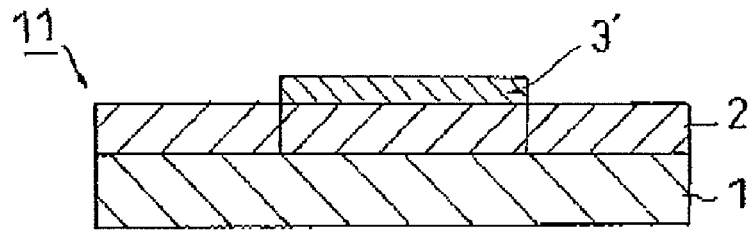
FIG. 2 is a cross-sectional schematic drawing showing a dicing die-bonding film according to another embodiment of the present invention.

The thermosetting die-bonding film (hereinafter, referred to as "the die-bonding film") of the present invention is described below using a dicing die-bonding film in which the die-bonding film is laminated together with a dicing film (a pressure-sensitive adhesive film) as an example. FIG. 1 is a cross-sectional schematic drawing showing a dicing die-bonding film according to the present embodiment. FIG. 2 is a cross-sectional schematic drawing showing another dicing die-bonding film according to the present embodiment.

As shown in FIG. 1, a dicing die-bonding film 10 has a configuration in which a die-bonding film 3 is laminated onto a dicing film 11. The dicing film 11 is configured by laminating a pressure-sensitive adhesive layer 2 onto a supporting base material 1, and the die-bonding film 3 is provided on the pressure-sensitive adhesive layer 2. Further, the present invention may have a configuration in which a die-bonding film 3' is formed only on a workpiece pasting portion.

The base material 1 has ultraviolet ray transparency and is a strength matrix of the dicing die-bonding films 10, 12. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the base material 1 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 2 and the die-bonding films 3, 3' is reduced by thermally shrinking the base material 1 after dicing, and the recovery of the semiconductor chips can be facilitated.

A known surface treatment such as a chemical or physical treatment such as a chromate treatment, ozone exposure, flame exposure, high voltage electric exposure, and an ionized radiation treatment, and a coating treatment by an undercoating agent (for example, a tacky substance described later) can be performed on the surface of the base material 1 in order to improve adhesiveness, holding properties, etc. with the adjacent layer.

The same type or different type of base material can be appropriately selected and used as the base material 1, and a base material in which a plurality of types are blended can be used depending on necessity. Further, a vapor-deposited layer of a conductive substance composed of a metal, an alloy, an oxide thereof, etc. and having a thickness of about 30 to 500 angstrom can be provided on the base material 1 in order to give an antistatic function to the base material 1. The base material 1 may be a single layer or a multi layer of two or more types.

The thickness of the base material 1 can be appropriately decided without limitation particularly. However, it is generally about 5 to 200 μm.

The pressure-sensitive adhesive layer 2 is constituted by containing an ultraviolet-curable pressure sensitive adhesive. The ultraviolet-curable pressure sensitive adhesive can easily decrease its adhesive strength by increasing the degree of crosslinking by irradiation with ultraviolet ray. By radiating only a part 2a corresponding to the semiconductor wafer pasting part of the pressure-sensitive adhesive layer 2 shown in FIG. 2, a difference of the adhesive strength to another part 2b can be also provided.

Further, by curing the ultraviolet-curable pressure-sensitive adhesive layer 2 with the die-bonding film 3' shown in FIG. 2, the part 2a in which the adhesive strength is remarkably decreased can be formed easily. Because the die-bonding film 3' is pasted to the part 2a in which the adhesive strength is decreased by curing, the interface of the part 2a of the pressure-sensitive adhesive layer 2 and the die-bonding film 3' has a characteristic of being easily peeled during pickup. On the other hand, the part not radiated by ultraviolet rays has sufficient adhesive strength, and forms the part 2b.

As described above, in the pressure-sensitive adhesive layer 2 of the dicing die-bonding film 10 shown in FIG. 1, the cart 2b formed by a non-cured ultraviolet-curable pressure sensitive adhesive sticks to the die-bonding film 3, and the holding force when dicing can be secured. In such a way, the ultraviolet-curable pressure sensitive adhesive can support the die-bonding film 3 for fixing the semiconductor chip onto an adherend such as a substrate with good balance of adhesion and peeling. In the pressure-sensitive adhesive layer 2 of the dicing die-bonding film 11 shown in FIG. 2, a dicing ring is fixed to the part 2b.

The ultraviolet-curable pressure-sensitive adhesive having an ultraviolet-curable functional group such as a carbon-carbon double bond, and showing adhesiveness can be used especially without limitation. An example of the ultraviolet-curable pressure-sensitive adhesive includes an adding type radiation-curable pressure-sensitive adhesive, in which an ultraviolet-curable monomer component or oligomer component is compounded into a general pressure-sensitive adhesive such as the above-described acrylic adhesive and rubber adhesive.

An acrylic pressure-sensitive adhesive having an acrylic polymer as a base polymer is preferable as the above-described pressure-sensitive adhesive from the respect of clean washing properties, etc. of electronic parts that dislike contamination such as a semiconductor wafer and glass, with ultrapure water or an organic solvent such as an alcohol.

Examples of the acrylic polymer include acrylic polymers each comprising, as one or more monomer components, one or more selected from alkyl esters of (meth)acrylic acid (for example, linear and branched alkyl esters thereof each having an alkyl group having 1 to 30 carbon atoms, in particular, 4 to 18 carbon atoms, such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, and eicosyl ester thereof) and cycloalkyl esters of (meth)acrylic acid (for example, cyclopentyl ester and cyclohexyl ester thereof). The wording "esters of (meth)acrylic acid" means esters of acrylic acid and/or methacrylic acid. All of the words including "(meth)" in connection with the present invention have an equivalent meaning.

The acrylic polymer may optionally contain a unit corresponding to a different monomer component copolymerizable with the above-mentioned alkyl ester of (meth) acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl(meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxylmethylcyclohexyl)methyl(meth)acrylate; sulfonic acid group containing monomers such as styrenesulfonic acid, allylsulfonic acid, 2-(meth) acrylamide-2-methylpropanesulfonic acid, (meth) acrylamidepropanesulfonic acid, sulfopropyl (meth)acrylate, and (meth) acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

Furthermore, the above-described acrylic polymer can also include a multi-functional monomer, etc. as a monomer component for copolymerization depending on the necessity to crosslink. Examples of such multi-functional monomer include hexanedioldi(meth)acrylate, (poly) ethyleneglycoldi(meth)acrylate, (poly)propyleneglycoldi(meth)acrylate, neopentylglycoldi(meth)acrylate, pentaerythritoldi(meth) acrylate, trimethylolpropanetri(meth) acrylate, pentaerythritoltri(meth)acrylate, dipentaerythritolhexa(meth)acrylate, epoxy (meth)acrylate, polyester(meth)acrylate, and urethane(meth) acrylate. One type or two types or more of these multi-functional monomers can be used. An amount to be used of the multi-functional monomer is preferably 30% by weight or less of the entire monomer component from the viewpoint of adhesion characteristics, etc.

The acryl polymer can be obtained by polymerizing a single monomer or a monomer mixture of two or more types. The polymerization can be performed with any of methods such as solution polymerization, emulsifying polymerization, bulk polymerization, and suspension polymerization. From the viewpoint of prevention of contamination to a clean adherend, etc., the content of a low molecular weight substance is preferably small. From this viewpoint, the weight average molecular weight of the acryl polymer is preferably 30,000 or more, and more preferably about 400,000 to 3,000,000.

Further, an external crosslinking agent can be also appropriately adopted in the above-described pressure-sensitive adhesive in order to increase a number average molecular weight of the acrylic polymer that is the base polymer, etc. A specific means of the external crosslinking method includes a method of reacting by adding a so-called crosslinking agent such as a polyisocyanate compound, an epoxy compound, an aziridine compound, and a melamine crosslinking agent. In the case of using an external crosslinking agent, its used amount is determined appropriately by the balance with the base polymer that has to be crosslinked, and further by its use in the pressure-sensitive adhesive agent. Generally, it is compounded preferably 5 parts by weight or less, and further preferably 0.1 to 5 parts by weight. Furthermore, additives such as various conventionally know tackifiers and antioxidants may be used besides the above-described components depending on necessity.

The UV curing monomer component to be compounded includes, for example, polyvalent alcohol (meth)acrylates such as trimethylol propane tri(meth)acrylate, tetramethylol methane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butane diol di(meth)acrylate, tetraethylene glycol di(meth)acrylate, 1,6-hexane diol (meth)acrylate, neopentyl glycol di(meth)acrylate etc.; ester acrylate oligomers; and isocyanurates or isocyanurate compounds such as 2-propenyl-3-butenyl cyanurate, tris(2-methacryloxyethyl) isocyanurate etc. The UV curing oligomer component includes various acrylate oligomers such as those based on urethane, polyether, polyester, polycarbonate, polybutadiene etc., and their molecular weight is preferably in the range of about 100 to 30000. For the compounded amount of the radiation-curable monomer component or oligomer component, the amount of which the adhesive strength of the pressure-sensitive adhesive layer can be decreased can be determined appropriately depending on the type of the above-described pressure-sensitive adhesive layer. In general, the compounded amount is, for example, 5 to 500 parts by weight relative to 100 parts by weight of the base polymer such as an acrylic polymer constituting the pressure-sensitive adhesive, and preferably about 40 to 150 parts by weight.

The radiation-curing pressure-sensitive adhesive includes an internal radiation-curing pressure-sensitive adhesive using a base polymer having a carbon-carbon double bond in a polymer side chain, in a main chain or at the end of the main chain, in addition to the addition-type radiation-curing pressure-sensitive adhesive described above. The internal radiation-curing pressure-sensitive adhesive does not require incorporation of low-molecular components such as oligomer components etc., or does not contain such compounds in a large amount, and thus the oligomer components etc. do not move with time through the pressure-sensitive adhesive, thus preferably forming the pressure-sensitive adhesive layer having a stabilized layer structure.

A base polymer having a carbon-carbon double bond and having adherability can be used as the base polymer having the above-described carbon-carbon double bond without particular limitation. A base polymer having an acrylic polymer as a basic skeleton is preferable as such a base polymer. An example of the basic skeleton of an acrylic polymer is the acrylic polymer exemplified above.

As the base polymer having a carbon-carbon double bond, a polymer having a carbon-carbon double bond and exhibiting tackiness can be used without particular limitation. Such base polymer is preferably a polymer having an acrylic polymer as a fundamental skeleton. The fundamental skeleton of the acrylic polymer includes the acrylic polymer illustrated above.

Examples of a combination of these functional groups include a carboxylic acid group and an epoxy group, a carboxylic acid group and an aziridyl group, and a hydroxyl group and an isocyanate group. Among the combination of these functional groups, a combination of a hydroxyl group and an isocyanate group is preferable due to easiness of tracking the reaction. Further, with the combination of these functional groups, if it is a combination to produce the acrylic polymer having the above-described carbon-carbon double bond, the functional group may be located in either side of the acrylic polymer or the above-described compound. However, in the above-described preferred combination, the case that the acrylic polymer has a hydroxyl group and the above-described compound has an isocyanate group is suitable. In this case, examples of the isocyanate compound having a carbon-carbon double bond include methacryloylisocyanate, 2-methacryloyloxyethylisocyanate, and m-isopropenyl-$\alpha,\alpha$-dimethylbenzylisocyanate. Further, as the acrylic polymer, an acrylic polymer is used in which the hydroxyl group containing the monomer exemplified above, an ether compound such as 2-hydroxyethylvinylether, 4-hydroxybutylvinylether, and diethyleneglycolmonovinylether, etc. are copolymerized.

In the above-described internal-type ultraviolet-ray curing-type pressure-sensitive adhesive, the above-described base polymer having a carbon-carbon double bond (particularly, the acrylic polymer) can be used alone. However, the above-described ultraviolet curable monomer component or oligomer component can be also compounded to a level that the characteristics are deteriorated. The ultraviolet-ray curable oligomer component, etc. are normally in the range of 30 parts by weight, and preferably in the range of 0 to 10 parts by weight based on 100 parts by weight of the base polymer.

For curing with UV rays, a photopolymerization initiator is incorporated into the radiation-curing pressure-sensitive adhesive. The photopolymerization initiator includes, for example, $\alpha$-ketol compounds such as 4-(2-hydroxyethoxy)phenyl(2-hydroxy-2-propyl)ketone, $\alpha$-hydroxy-$\alpha,\alpha'$-dimethyl acetophenone, 2-methyl-2-hydroxypropiophenone, 1-hydroxycyclohexyl phenyl ketone etc.; acetophenone compounds such as methoxyacetophenone, 2,2-dimethoxy-2-phenylacetophenone, 2,2-diethoxyacetophenone, 2-methyl-1-[4-(methylthio)-phenyl)]-2-morpholinopropane-1 etc.;

benzoin ether compounds such as benzoin ethyl ether, benzoin isopropyl ether, anisoin methyl ether etc.; ketal compounds such as benzyl dimethyl ketal etc.; aromatic sulfonyl chloride compounds such as 2-naphthalene sulfonyl chloride etc.; optically active oxime compounds such as 1-phenone-1,1-propanedione-2-(o-ethoxycarbonyl)oxime etc.; benzophenone compounds such as benzophenone, benzoylbenzoic acid, 3,3'-dimethyl-4-methoxybenzophenone etc.; thioxanthone compounds such as thioxanthone, 2-chlorothioxanthone, 2-methyl thioxanthone, 2,4-dimethyl thioxanthone, isopropyl thioxanthone, 2,4-dichlorothioxanthone, 2,4-diethyl thioxanthone, 2,4-diisopropyl thioxanthone etc.; camphor quinone; halogenated ketone; acyl phosphinoxide; acyl phosphonate etc. The amount of the photopolymerization initiator to be incorporated is for example about 0.05 to 20 parts by weight, based on 100 parts by weight of the base polymer such as acrylic polymer etc. constituting the pressure-sensitive adhesive.

The radiation-curing pressure-sensitive adhesive includes, for example, those disclosed in JP-A 60-196956, such as a rubber-based pressure-sensitive adhesive and an acrylic pressure-sensitive adhesive, comprising an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine or an onium salt compound.

The adhesive strength of the above-described pressure-sensitive adhesive layer 2 after ultraviolet-ray curing is 0.001 to 1 N/10 mm, preferably 0.005 to 0.5 N/10 mm, and more preferably 0.01 to 0.1 N/10 mm to the die-bonding films 3, 3' (180 degree peel releasing force, peeling rate 300 mm/mm). When it is in the above-described value range, better pickup properties of the die-bonding film are attempted without fixing the semiconductor chip more than necessary when picking up the semiconductor chip with an adhesive.

The method of forming the part 2a in the pressure-sensitive adhesive layer 2 includes a method of forming the ultraviolet-curable pressure-sensitive adhesive layer 2 on the base material 1 and then radiating the part 2a with radiation partially and curing. The partial radiation irradiation can be performed through a photo mask in which a pattern is formed which is corresponding to a part 3b, etc. other than the semiconductor wafer pasting part 3a. Further, examples include a method of radiating in a spot manner and curing, etc. The formation of the ultraviolet-curable pressure-sensitive adhesive layer 2 can be performed by transferring the pressure-sensitive adhesive layer provided on a separator onto the base material 1. The partial radiation curing can be also performed on the ultraviolet-curable pressure-sensitive adhesive layer 2 provided on the separator.

In the pressure-sensitive adhesive layer 2 of the dicing die-bonding film 10, the radiation irradiation may be performed on a part of the pressure-sensitive adhesive layer 2 so that the adhesive strength of the part 2a becomes smaller than the adhesive strength of other parts 2b. That is, the part 2a in which the adhesive strength is decreased can be formed by using those in which the entire or a portion of the part other than the part corresponding to the semiconductor wafer pasting part 3a on at least one face of the base material 1 is shaded, forming the ultraviolet-curable pressure-sensitive adhesive layer 2 onto this, then radiating radiation, and curing the part corresponding the semiconductor wafer pasting part 3a. The shading material that can be a photo mask on a supporting film can be manufactured by printing, vapor deposition, etc. Accordingly, the dicing die-bonding film 10 of the present invention can be produced with efficiency.

The thickness of the pressure-sensitive adhesive layer 2 is not particularly limited. However, it is preferably about 1 to 50 μm from the viewpoints of compatibility of chipping prevention of the chip cut face and holding the fixation of the adhesive layer, etc. It is preferably 2 to 30 μm, and further preferably 5 to 25 μm.

The die-bonding films 3, 3' contain 15 to 30% by weight of a thermoplastic resin component and 60 to 70% by weight of a thermosetting resin component as main components. Further, a surface free energy is 37 mJ/m$^2$ or more and less than 40 mJ/m$^2$ before heat curing.

By setting the lower limit of a thermoplastic resin component to 15% by weight and the upper limit of a thermosetting resin component to 70% by weight, a surface free energy of the above-described adhesive film before heat curing is set to 37 mJ/m$^2$ or more. As a result, the adhesion of the die-bonding film to the adherent is made to be preferable. On the other hand, by setting the upper limit of the thermoplastic resin component to 30% by weight and the lower limit of a thermosetting resin component to 60% by weight, the above-described surface free energy is set to less than 40 mJ/m$^2$. As a result, peeling properties to the pressure-sensitive adhesive layer 2 are made to be preferable, and the pickup properties during the pickup step described later can be improved.

Further, the tensile storage elastic modulus of the above-described die-bonding film at 250° C. before heat curing is preferably 10 MPa or more, and more preferably 15 to 100 MPa. Adjustment of the tensile storage elastic modulus is possible by adjusting the amount to be used of inorganic filler. Moreover, heat curing means the case of performing a heat treatment at 80 to 240° C., preferably 80 to 175° C., more preferably 100 to 175° C., for 0.1 to 24 hours, preferably 0.1 to 4 hours, and more preferably 0.1 to 1 hour.

Further, a glass transition point of the above-described die-bonding film after heat curing is preferably 175° C. or more, and more preferably 185 to 210° C. By setting the glass transition point to 175° C. or more, the semiconductor element is prevented from inclining in the sealing step described later, and generation of peeling can be prevented between the die-bonding film and the adherent during the solder reflow step. Adjustment of the glass transition point of the die-bonding film after heat curing is possible by the amount to be used of the thermosetting resin, for example. In this case, in order to set the glass transition point to 175° C. or more, the amount to be used of the thermosetting resin is preferably 400 to 1000% by weight based on 100% by weight of the thermoplastic resin component.

A coefficient of water absorption of the die-bonding film after heat curing when left in an atmosphere of 85° C. and 85% RH for 168 hours is preferably 1% by weight or less. By setting the coefficient of water absorption to 1% by weight or less, generation of voids can be prevented in the reflow step, for example. Adjustment of the coefficient of water absorption is possible by adjusting the amount to be used of an inorganic filler, for example.

The weight loss amount after heat curing by the above-described heating and after hating at 250° C. for 1 hour is preferably 1% by weight or less. By setting the weight loss amount to 1% by weight or less, generation of cracks can be prevented in a package in the reflow step, for example. The adjustment of the weight loss amount is possible by adjusting the amount to be used of the inorganic filler, for example.

The lamination structure of the die-bonding films 3, 3' is not particularly limited, and examples include a structure made only of a single layer of the adhesive layer, and a multi-layered structure in which the adhesive layer is formed on one side or both sides of a core material. Examples of the above-described core material include a film (such as a polyimide film, a polyester film, a polyethylenetexephthalate film, a polyethylenenaphthalate film, and polycarbonate film), a resin substrate reinforced with glass fibers or plastic unwoven fibers, a silicon substrate, and a glass substrate.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon (registered trademark) and 6,6-nylon (registered trademark), phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxymethylcyclohexyl)methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth) acryloyloxynaphthalenesulfonic acid; and monomers which contain a phosphoric acid group, such as 2-hydroxyethylacryloyl phosphate.

Examples of the above-described thermosetting resin include a phenol resin, an amino resin, an unsaturated polyester resin, an epoxy resin, a polyurethane resin, a silicone resin, and a thermosetting polyimide resin. These resins can be used alone, or two or more of them can be used together. Particularly, an epoxy resin is preferable having fewer ionic impurities, etc. that corrode a semiconductor element. Further, a phenol resin is preferable as a curing agent of the epoxy resin.

The above-described epoxy resin is not particularly limited as along as it is generally used as an adhesive composition, and examples thereof include a bifunctional epoxy resin and a multifunctional epoxy resin of a bisphenol A type, a bisphenol F type, a bisphenol S type, a brominated bisphenol A type, a hydrogenated bisphenol A type, a bisphenol AF type, a bisphenyl type, a naphthalene type, a fluorene type, a phenol novolak type, an o-cresol novolak type, a trishydroxyphenylmethane type, a tetraphenylolethane type, etc. and an epoxy resin of a hydantoin type, a trisglycidylisocyanurate type, a glycidylamine type, etc. These can be used alone, or two or more of them can be used together. Among these epoxy resins, a novolak type epoxy resin, a biphenyl type epoxy resin, a trishydroxyphenylmethane type resin, and a tetraphenylolethane type epoxy resin are particularly preferable. This is because these epoxy resins have rich reactivity with the phenol resin as a curing agent and are excellent in heat resistance, etc.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

Moreover, in the present invention, a die-bonding film using an epoxy resin, a phenol resin, and an acrylic resin is particularly preferable. Because these resins have fewer ionic impurities and high heat resistance, the reliability of the semiconductor element can be secured. For the compounding ratio of this case, a mixed amount of the epoxy resin and the phenol resin is 10 to 1000 parts by weight based on 100 parts by weight of the acrylic resin component.

In the case of crosslinking the die-bonding films 3, 3' in the present invention to the same level in advance, a multifunctional compound that reacts with the functional group, etc. of the molecular chain end of a polymer may be added as a crosslinking agent during production. Thus, the adhesion characteristics under high temperature are improved, and the improvement of the heat resistance can be attempted.

A conventional known crosslinking agent can be adopted as the above-described crosslinking agent. Particularly, a polyisocyanate compound such as tolylenediisocyanate, diphenylmethanediisocyanate, p-phenylenediisocyanate, 1,5-naphthalenediisocyanate, and an adduct of a polyhydric alcohol and diisocyanate are more preferable. The amount to be used of the crosslinking agent is normally preferably set to 0.05 to 7 parts by weight based on 100 parts by weight of the above-described polymer. When the amount of the crosslinking agent is more than 7 parts by weight, it is not preferable because the adhering strength decreases. On the other hand, when it is less than 0.05 part by weight, it is not preferable because the cohesive strength becomes insufficient. Further, other multifunctional compounds such as an epoxy resin may be contained together with such a polyisocyanate compound depending on necessity.

Examples of the inorganic fillers include various inorganic powders made of the following: a ceramic such as silica, clay, plaster, calcium carbonate, barium sulfate, aluminum oxide, beryllium oxide, silicon carbide or silicon nitride, a metal such as aluminum, copper, silver, gold, nickel, chromium, lead, tin, zinc, palladium or solder, or an alloy thereof; and carbon. These may be used alone or in combination of two or more thereof. Among these, silica, in particular fused silica is preferably used. The average particle size of the inorganic filler materials is preferably in the range of 0.1 to 80 μm, The amount of the inorganic filler to be incorporated is set into the range of 0 to 200 parts by weight, preferably 0 to 150 parts by weight, more preferably 0 to 80 parts by weight, specially preferably 0 to 70 parts by weight for 100 parts by weight of the organic resin components. When the tensile storage modulus is set to 10 MPa or more at 250° C. after the film is thermally set, the blended amount of the inorganic filler is set into the range of preferably 50 to 150 parts by weight, more preferably 0 to 15 parts by weight for 100 parts by weight of the organic resin components. When the coefficient of water absorption after heat curing by heating when left in an atmosphere at 85° C. and 85% RH for 168 hours is 1% by weight or less, the blended amount of the inorganic filler is set preferably to an amount more than 50 to 150 parts by weight for 100 parts by weight of the organic resin components.

If necessary, other additives besides the inorganic filler may be incorporated into the die bonding film of the present invention. Examples thereof include a flame retardant, a silane coupling agent, and an ion trapping agent.

Examples of the flame retardant include antimony trioxide, antimony pentaoxide, and brominated epoxy resin. These may be used alone or in combination of two or more thereof.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof.

Examples of the ion trapping agent include hydrotalcite and bismuth hydroxide. These may be used alone or in combination of two or more thereof.

The thickness of the die bonding film (in the case that the film is a laminate, the total thickness thereof) is not particularly limited, and is, for example, from about 5 to 100 μm, preferably from about 5 to 50 μm.

The dicing die-bonding films 3, 3' of the above-described dicing die-bonding films 10, 12 are preferably protected with a separator (not shown). The separator has a function as a protecting material to protect the die-bonding films 3, 3' until they are provided into a practical use. Further, the separator can be used as a supporting base material when transferring the die-bonding films 3, 3' onto the pressure-sensitive adhesive layer 2. The separator is peeled when pasting the workpiece onto the die-bonding films 3, 3' of the dicing die-bonding film. Examples of the separator that can be used include a polyethylene terephthalate (PET) film, a polyethylene film, a polypropylene film, and a plastic film and a paper whose surfaces are coated with a peeling agent such as a fluorine peeling agent and a long-chain alkylacrylate peeling agent.

(Manufacturing Method of the Semiconductor Device)

The dicing die-bonding films 10, 12 in the present invention are used as follows by appropriately peeling the separator that is arbitrarily provided on the die-bonding films 3, 3'. In the following, it is described with the case of using the dicing die-bonding film 10 as an example and by referring to the drawings.

First, a semiconductor wafer 4 is press-adhered on the die-bonding film 3' in the dicing die-bonding film 11, and it is fixed by adhering and holding (mounting step). The present step is performed while pressing with a pressing means such as a pressing roll.

Next, the dicing of the semiconductor wafer 4 is performed. Accordingly, the semiconductor wafer 4 is cut into a prescribed size and individualized, and a semiconductor chip is produced. The dicing is performed following a normal method from the circuit face side of the semiconductor wafer 4, for example. Further, the present step can adopt such as a cutting method called full-cut that forms a slit in the dicing die-bonding film 10. The dicing apparatus used in the present step is not particularly limited, and a conventionally known apparatus can be used. Further, because the semiconductor wafer is adhered and fixed by the dicing die-bonding film 10, chip crack and chip fly can be suppressed, and at the same time the damage of the semiconductor wafer can be also suppressed.

Pickup of the semiconductor chip 5 is performed in order to peel a semiconductor chip that is adhered and fixed to the dicing die-bonding film 10. The method of picking up is not particularly limited, and conventionally known various methods can be adopted. Examples include a method of pushing up the individual semiconductor chip 5 from the dicing die-bonding 10 side with a needle and picking up the pushed semiconductor chip 5 with a picking-up apparatus.

Here, the picking up is performed after radiating the pressure-sensitive adhesive layer 2 with ultraviolet rays because the pressure-sensitive adhesive layer 2 is an ultraviolet curable type pressure-sensitive adhesive layer. Accordingly, the adhesive strength of the pressure-sensitive adhesive layer 2 to the die-bonding film 3a decreases, and the peeling of the semiconductor chip 5 becomes easy. As a result, picking up becomes possible without damaging the semiconductor chip. The condition such as irradiation intensity and irradiation time when irradiating an ultraviolet ray is not particularly limited, and it may be appropriately set depending on necessity. Further, the light source as described above can be used as a light source used in the ultraviolet irradiation.

The semiconductor chip 5 picked up is adhered and fixed to an adherend 6 through the die-bonding film 3a interposed therebetween (die bonding). The adherend 6 is mounted onto a heat block 9. Examples of the adherend 6 include such as a lead frame, a TAB film, a substrate, and a semiconductor chip separately produced. The adherend 6 may be a deformable adherend that are easily deformed, or may be a non-deformable adherend (a semiconductor wafer, etc.) that is difficult to deform, for example.

A conventionally known substrate can be used as the substrate. Further, a metal lead frame such as a Cu lead frame and a 42 Alloy lead frame and an organic substrate composed of glass epoxy, BT (bismaleimide-triazine), and polyimide can be used as the lead frame. However, the present invention is not limited to this, and includes a circuit substrate that can be used by mounting a semiconductor element and electrically connecting with the semiconductor element.

When the die-bonding film 3 is a thermosetting type die-bonding film, the semiconductor chip 5 is adhered and fixed onto the adherend 6 by heat-curing to improve the heat resistance strength. Here, a product in which the semiconductor chip 5 is adhered and fixed onto a substrate etc. through the semiconductor wafer pasting part 3a interposed therebetween can be subjected to a reflow step.

Further, in the above-described die bond, the die-bonding film 3 may be simply temporarily fixed onto the adherend 6 without curing. After that, wire bonding is performed without undergoing the heating step, the semiconductor chip is sealed with a sealing resin, and the sealing resin can be post-cured.

In this case, as the die-bonding film 3, a die-bonding film having a shearing adhering strength during the temporary fixing of 0.2 MPa or more is preferably used, and more preferably a die-bonding film is used having that a shearing adhering strength is in the range of 0.2 to 10 MPa. When the shearing adhering strength of the die-bonding film 3 is 0.2 MPa or more, even when performing the wire bonding step without going through the heating step, shear deformation due to ultrasonic vibration or heating in the corresponding step does not occur in the adhesion surface of the die-bonding film 3 with the semiconductor chip 5 or the adherend 6. That is, the semiconductor element does not move due to the ultrasonic vibration during wire bonding, and thereby preventing the success rate of the wire bonding from decreasing.

The wire bonding step is a step of connecting tips of terminal moieties (inner leads) of the substrate or the like 6 electrically with electrode pads (not illustrated) on the semiconductor chip 5 through bonding wires 7. The bonding wires 7 may be, for example, gold wires, aluminum wires, or copper wires. The temperature when the wire bonding is performed is from 80 to 250° C., preferably from 80 to 220° C. The heating time is from several seconds to several minutes. The connection of the wires is performed by using a combination of vibration energy based on ultrasonic waves with compression energy based on the application of pressure in the state that the wires are heated to a temperature in the above-mentioned range.

The present step may be carried out without any sticking/fixing based on the die-bonding film 3a. In this case, the semiconductor chip 5 is not bonded to the adherend 6 through the die-bonding film 3a in the process of the step.

Figure 3:
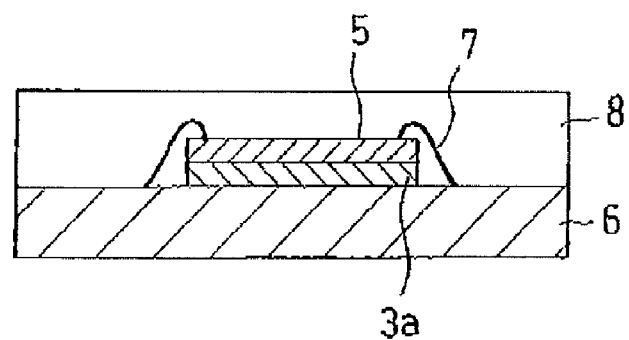
FIG. 3 is a cross-sectional schematic drawing showing an example of mounting a semiconductor chip through a die-bonding film according to one embodiment of the present invention.

The above-mentioned sealing step is a step of sealing the semiconductor chip 5 with a sealing resin 8 (see FIG. 3), and is performed to protect the semiconductor chip 5 and the bonding wires 7 mounted on the adherend 6. The present step is performed by molding the sealing resin with a mold or die. The sealing resin 8 may be, for example, an epoxy resin. The heating for the resin-sealing is performed usually at 175° C. for 60 to 90 seconds. In this invention, however, the heating is not limited to this, and may be performed, for example at 165 to 185° C. for several minutes. In such a way, the sealing resin is cured and further the semiconductor chip 5 and the adherend 6 are set to each other through the die-bonding film 3a. In this way, the sealing resin is cured. In addition thereto, in the case of the above-mentioned temporary sticking/fixing, the semiconductor chip 5 is bonded onto the substrate or the like 6 through the die-bonding film 3a. In short, even if the post-curing step, which will be detailed later, is not performed in this invention, the sticking/fixing based on the die-bonding film 3a can be attained in the present step so that the number of the producing steps can be reduced and the term for producing the semiconductor device can be shortened.

In the post-curing step, the sealing resin 8, which is not sufficiently cured in the sealing step, is completely cured. Even if the semiconductor chip 5 and the adherend 6 are not set to each other through the die-bonding film 3a in the sealing step, the sealing resin 8 is cured and further they are set through the die-bonding film 3a in the present step. The heating temperature in the present step is varied dependently on the kind of the sealing resin, and is, for example, in the range of 165 to 185° C. The heating time is from about 0.5 to 8 hours.

Figure 4:
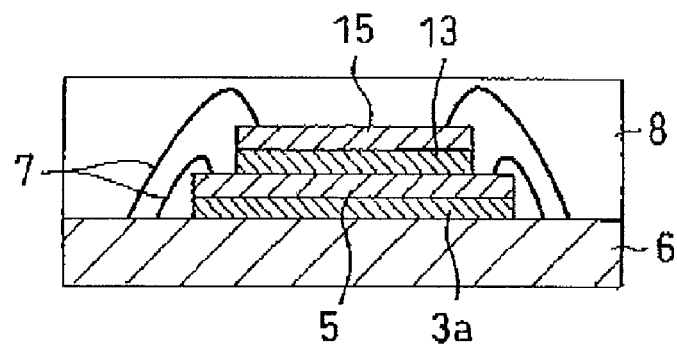
FIG. 4 is a cross-sectional schematic drawing showing an example of three-dimensionally mounting a semiconductor chip through the above-described die-bonding film.

The dicing die-bonding film of the invention also can be preferably used in the case of three-dimensional mounting also in which plural semiconductor chips are laminated, as illustrated in FIG. 4. FIG. 4 is a schematic sectional view illustrating an example wherein semiconductor chips are three-dimensionally mounted through a die bonding film. In the case of the three-dimensional mounting illustrated in FIG. 4, at least one die-bonding film 3a cut out so as to have a size equal to that of a semiconductor chip 5 is bonded to a adherend 6, and then the semiconductor chip 5 is bonded onto the adherend 6 through the die-bonding film 3a so as to direct its wire bonding face upwards. Next, a die-bonding film 13 is bonded onto the semiconductor chip 5 avoiding its electrode pad portions. Furthermore, another semiconductor chip 15 is bonded onto the die-bonding film 13 so as to direct its wire bonding face upwards.

Then, the wire bonding step is performed without performing the heating step. By the step, each electrode pad in the semiconductor chip 5 and the semiconductor chip 15 is electrically connected with the bonding wire 7.

Subsequently, a sealing step of sealing the semiconductor chips 5 with a sealing resin 8 is performed to cure the sealing resin 8. In addition thereto, the adherend 6 and one of the semiconductor chips 5 are bonded to each other through the die-bonding film 3a. One of the semiconductor chips 5 and one of another semiconductor chips 15 are bonded to each other. After the sealing step, a post-curing step may be performed.

In the case of the three-dimensional mounting of the semiconductor chips, the production process is simplified and the yield is improved since heating treatment by heating the die bonding films 3a and 13 is not conducted. Furthermore, the adherend 6 is not warped, and the semiconductor chips 5 and 15 are not cracked; thus, the semiconductor element can be made still thinner.

Figure 5:
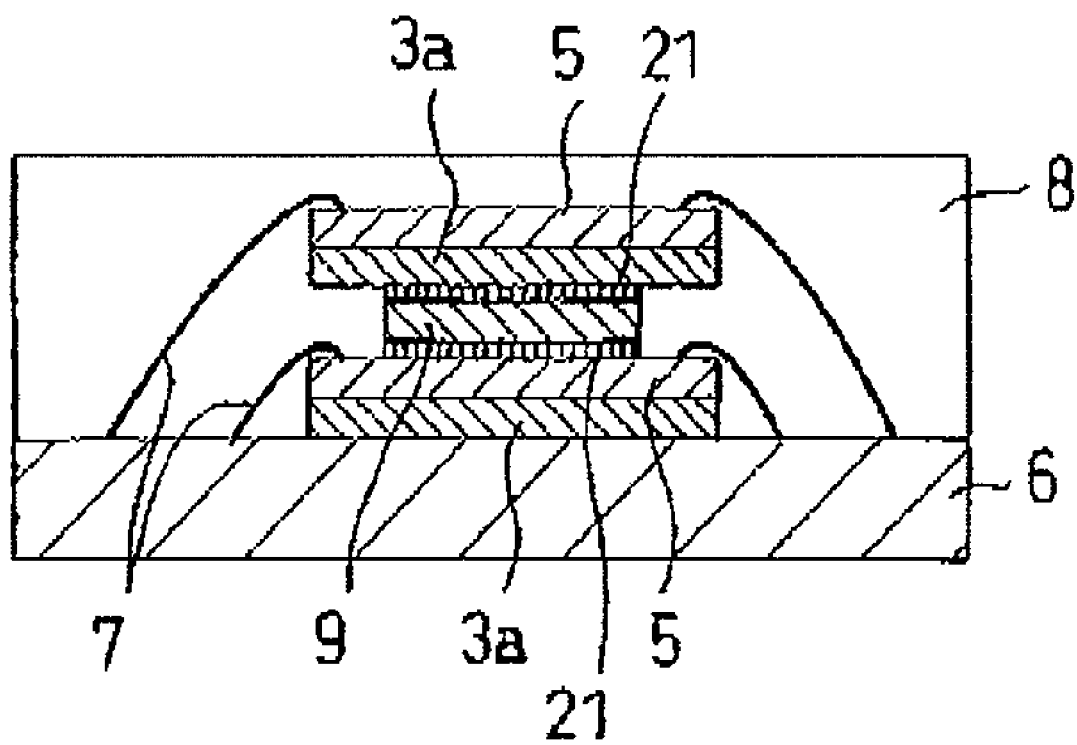
FIG. 5 is a cross-sectional schematic drawing showing an example of three-dimensionally mounting two semiconductor chips using the above-described die-bonding film through a spacer.

Three-dimensional mounting may performed in which semiconductor chips are laminated through die-bonding films so as to interpose a spacer between the semiconductor chips, as illustrated in FIG. 5. FIG. 5 is a schematic sectional view illustrating an example wherein two semiconductor chips are three-dimensionally mounted through die bonding films so as to interpose a spacer between the chips.

In the case of the three-dimensional mounting illustrated in FIG. 5, first, a die-bonding film 3a, a semiconductor chip 5, and a die bonding film 21 are successively laminated on an adherend 6 to bond these members. Furthermore, on the die bonding film 21 are successively laminated a spacer 9, another die bonding film 21, another die-bonding film 3a, and another semiconductor chip 5 to bond these members.

Next, the wire bonding step is performed as shown in FIG. 5 without performing the heating step. By the step, the electrode pad in the semiconductor chip 5 and the adherend 6 are electrically connected with the bonding wire 7.

Subsequently, a sealing step of sealing the semiconductor chips 5 with a sealing resin 8 is performed to cure the sealing resin 8. In addition thereto, in the case of the above-mentioned temporary sticking/fixing, the adherend 6 and one of the semiconductor chips 5 are bonded to each other, and the semiconductor chips 5 and the spacer 9 are bonded to each other through the die bonding films 3a and 21. In this way, a semiconductor package is obtained. The sealing step is preferably performed by a package sealing method wherein only the semiconductor chip 5 is sealed. The sealing is performed to protect the semiconductor chips 5 adhered onto the adhesive sheet(s). The method therefore is typically a method of using the sealing resin 8 and molding the resin 8 in a metal mold. At this time, it is general to use a metal mold composed of an upper metal mold part and a lower metal mold part and having plural cavities to seal simultaneously. The heating temperature at the time of the sealing preferably ranges, for example, from 170 to 180° C. After the sealing step, a post-curing step may be performed.

The spacer 9 is not particularly limited, and may be made of, for example, a silicon chip or polyimide film and the like known in the prior art. The spacer may be a core member. The core member is not particularly limited, and may be a core member known in the prior art. Specific examples thereof include films (such as a polyimide film, a polyester film, a polyethylene terephthalate film, a polyethylene naphthalate film, a polycarbonate film and the like), resin substrates each reinforced with glass fiber or plastic nonwoven fiber, mirror silicon wafers, silicon substrates, and glass substrates.

Next, the above-described semiconductor package is surface-mounted on a printed wiring board. An example of a method of surface-mounting is reflow soldering in which the solder is supplied onto the printed wiring board in advance and then soldering is performed by heat-melting with warm air, etc. Examples of the heating method include hot-air reflow and infrared reflow. Further, any method of entire heating and local heating may be used. The heating temperature is preferably in the range of 240 to 265° C., and the heating time is preferably in the range of 1 to 20 seconds.

(Other Matters)

When semiconductor elements are three-dimensional mounted onto any one of the above-mentioned substrates, a buffer coat layer may be formed on the substrate surface on which circuits of the semiconductor elements are formed. The buffer coat layer may be, for example, a silicon nitride film, or a layer made of a heat-resistant resin such as polyimide resin.

The compositions of the adhesive sheets used in the respective stages at the time of the three-dimensional mounting of the semiconductor elements may be the same, but not limited thereto, and may be appropriately varied dependently on the producing conditions or use purposes thereof, or the like.

About the above-mentioned embodiments, there are described embodiments wherein semiconductor elements are laminated on a substrate or the like and subsequently all the elements are subjected to a wire bonding step at a time. However, the present invention is not limited to the embodiments. For example, a wire bonding step may be performed every time when semiconductor elements are laminated on or over a substrate or the like.

EXAMPLE

Below, preferred examples of the present invention are explained in detail. However, materials, addition amounts, and the like described in these examples are not intended to limit the scope of the present invention, and are only examples for explanation as long as there is no description of limitation in particular.

Example 1

An adhesive composition having a concentration of 23.6% by weight was prepared by dissolving 144 parts of an epoxy resin 1 (EPIKOTE 1004 manufactured by Japan Epoxy Resins Co., Ltd.), 130 parts of an epoxy resin 2 (EPIKOTE 827 manufactured by Japan Epoxy Resins Co., Ltd.), 293 parts of a phenol resin (MILEX XLC-4L manufactured by Mitsui Chemicals, Inc.), 444 parts of sphere-shaped silica (SO-25R manufactured by Admax Co., Ltd.) and 2 parts of a curing catalyst (C11-Z manufactured by Shikoku Chemicals Corporation) based on 100 parts by weight of an acrylic ester polymer (Parakuron W-197CM manufactured by Negami Chemical Industrial Co., Ltd.) containing ethyl acrylate-methylmethacrylate as a main component into methylethylketone.

This solution of the adhesive composition was applied onto a release treated film made of a polyethylene terephthalate film having a thickness of 50 µm on which a silicone releasing treatment was performed as a releasing liner, and it was dried at 130° C. for 2 minutes. Thus, a die-bonding film A having a thickness of 40 µm was produced.

Example 2

An adhesive composition having a concentration of 23.6% by weight was prepared by dissolving 126 parts of an epoxy resin 1 (EPIKOTE 1004 manufactured by Japan Epoxy Resins Co., Ltd.), 68 parts of an epoxy resin 2 (EPIKOTE 827 manufactured by Japan Epoxy Resins Co., Ltd.), 206 parts of a phenol resin (MILEX XLC-4L manufactured by Mitsui Chemicals, Inc.), 333 parts of sphere-shaped silica (SO-25R manufactured by Admax Co., Ltd.), and 1.5 parts of a curing catalyst (C11-Z manufactured by Shikoku Chemicals Corporation) based on 100 parts by weight of an acrylic ester polymer (Parakuron W-197CM manufactured by Negami Chemical Industrial Co., Ltd.) containing ethyl acrylate-methylmethacrylate as a main component into methylethylketone.

This solution of the adhesive composition was applied onto a release treated film made of a polyethylene terephthalate film having a thickness of 50 µm which a silicone releasing treatment was performed as a releasing liner, and it was dried at 130° C. for 2 minutes. Thus, a die-bonding film B having a thickness of 40 µm was produced.

Comparative Example 1

An adhesive composition having a concentration of 23.6% by weight was prepared by dissolving 228 parts of an epoxy resin 1 (EPIKOTE 1004 manufactured by Japan Epoxy Resins Co., Ltd.) 206 parts of an epoxy resin 2 (EPIKOTE 827 manufactured by Japan Epoxy Resins Co., Ltd.), 465 parts of a phenol resin (MILEX XLC-4L manufactured by Mitsui Chemicals, Inc.), 667 parts of sphere-shaped silica (SO-25R manufactured by Admax Co., Ltd.), and 1 parts of a curing catalyst (C11-Z manufactured by Shikoku Chemicals Corporation) based on 100 parts by weight of an acrylic ester polymer (Parakuron W-197CM manufactured by Negami Chemical Industrial Co., Ltd.) containing ethyl acrylate-methylmethacrylate as a main component into methylethylketone.

This solution of the adhesive composition was applied onto a release treated film made of a polyethylene terephthalate film having a thickness of 50 µm on which a silicone releasing treatment was performed as a releasing liner, and it was dried at 130° C. for 2 minutes. Thus, a die-bonding film C having a thickness of 40 µm was produced.

Comparative Example 2

An adhesive composition having a concentration of 23.6% by weight was prepared by dissolving 88 parts of an epoxy resin 1 (EPIKOTE 1004 manufactured by Japan Epoxy Resins Co., Ltd.), 26 parts of an epoxy resin 2 (EPIKOTE 827 manufactured by Japan Epoxy Resins Co., Ltd.), 119 parts of a phenol resin (MILEX XLC-4L manufactured by Mitsui Chemicals, Inc.), 222 parts of sphere-shaped silica (so-25R manufactured by Admax Co., Ltd.), and 2 parts of a curing catalyst (C11-Z manufactured by Shikoku Chemicals Corporation) based on 100 parts by weight of an acrylic ester polymer (Parakuron W-197 CM manufactured by Negami Chemical Industrial Co., Ltd.) containing ethyl acrylate-methylmethacrylate as a main component into methylethyl ketone.

This solution of the adhesive composition was applied onto a release treated film made of a polyethylene terephthalate film having a thickness of 50 µm on which a silicone releasing treatment was performed as a releasing liner, and it was dried at 130° C. for 2 minutes. Thus, a die-bonding film D having a thickness of 40 µm was produced.

(Surface Free Energy)

The surface free energy before heat curing was calculated for each of the die-bonding films A to D obtained in the Examples and Comparative Examples. That is, contact angles of water and iodomethane were measured using a contact angle measuring instrument, and the surface free energy value was calculated from these contact angles with a geometric averaging method. The result is shown in Table 1.

(Pickup Properties)

Each of the die-bonding films A to D obtained in the Examples and Comparative Examples was pasted onto an 8-inch silicon mirror wafer (75 µm thick). Furthermore, a dicing tape (V-8-T manufactured by Nitto Denko Corporation) was pasted onto the die-bonding film at 40° C., and a dicing ring was also pasted so that the silicon mirror wafer was located in its inner side.

The wafer with the die-bonding film was cut into 2 nun squares using DFD651 manufactured by DISCO Corporation. The blade that was used was 126F-SE27HABB (manufactured by DISCO Corporation), and the cutting speed was set to 30 mm/sec.

Next, a silicon chip that was produced by dicing was picked up using a die bonder (SPA-300 manufactured by Shinkawa Ltd.), and evaluation of the pickup properties was performed. Specifically, 100 silicon chips were picked up, and their success rate was counted.

(Void Area)

Each of the die-bonding films A to D obtained in the Examples and Comparative Examples was pasted onto a semiconductor element at 40° C., and it was mounted to a BGA substrate at 160° C., 500 gf, and 2 s. Then, a semiconductor device was manufactured (a TFBGA package 16×16× 0.7 mm, chip size 5×5 mm) by performing heat curing at 175° C. for 1 hour and packaging with a sealing resin (GE-100 manufactured by Nitto Denko Corporation).

The void area on the pasting surface of the die-bonding films A to D and the BGA substrate was measured by cutting the semiconductor device after sealing and observing its cross section with a microscope.

(Measurement of Glass Transition Point ($T_g$))

The glass transition point of the obtained die-bonding films A to D after heat curing was measured from Tan(E''(loss elastic modulus)/E'(storage elastic modulus)) at a temperature increasing rate of 10° C./min and frequency of 1 MHz using a viscoelasticity measuring apparatus (Solid Analyzer RSII manufactured by Rheometric Scientific Co.).

(Measurement of Water Absorption)

About each of the resultant die-bonding films A-D, the water absorption after the film was thermally set was calculated from the weight reduction ratio thereof before and after the film was allowed to stand still for 168 hours in a thermostat having a temperature of 85° C. and a relative humidity of 85% RH.

(Measurement of the Amount of Weight Reduction)

About each of the resultant die-bonding films A-D, the amount of weight reduction after the film was thermally set was calculated from the amount of weights thereof before and after the film was allowed to stand still at 210° C. for 1 hour in a drying machine.

(Tensile Storage Modulus)

About each of the resultant die-bonding films A-D, the tensile storage modulus after the film was thermally set was measured at a temperature-raising rate of 10° C./minute and a frequency of 1 MHz, using a viscoelasticity measuring device (SOLID ANALYZER RSII, manufactured by Rheometic Scientific Co.).

(Results)

As found from Table 1 in the following, when the surface free energy is 37 mJ/m$^2$ or more and 40 mJ/m$^2$ or less, it was confirmed that an error does not occur in the pickup step, that the pickup properties of each die-bonding film in Examples become excellent, and that the void area after packaging becomes 1% by volume or less. On the other hand, when the surface free energy is 41 mJ/m$^2$ as for the die-bonding film in Comparative Example 1, it was found that a success rate of pickup decreases, and peeling properties to the adhesive layer is low. Further, when the surface free energy is 36 mJ/m$^2$ as for the die-bonding film in Comparative Example 2, it was found that the void area becomes 8.9% by volume and that there is a fear that the reliability of the semiconductor device that is manufactured decreases.

TABLE 1

|  | EXAMPLE 1 DIE-BONDING FILM A | EXAMPLE 2 DIE-BONDING FILM B | COMPARATIVE EXAMPLE 1 DIE-BONDING FILM C | COMPARATIVE EXAMPLE 2 DIE-BONDING FILM D |
|---|---|---|---|---|
| SURFACE FREE ENERGY (mJ/m$^2$) | 38 | 37 | 41 | 36 |
| EVALUATION OF PICKUP (clear/100) | 100/100 | 100/100 | 67/100 | 100/100 |
| VOID AREA (Vol %) | 1 vol % OR LESS | 1 vol % OR LESS | 1 vol % OR LESS | 8.9 vol % |
| GLASS TRANSITION POINT (° C.) | 181 | 173 | 188 | 162 |
| COEFFICIENT OF WATER ABSORPTION (% by weight) | 0.3 | 0.4 | 0.3 | 0.4 |
| WEIGHT LOSS AMOUNT (% by weight) | 0.6 | 0.7 | 0.7 | 0.8 |

TABLE 1-continued

|  | EXAMPLE 1 DIE-BONDING FILM A | EXAMPLE 2 DIE-BONDING FILM B | COMPARATIVE EXAMPLE 1 DIE-BONDING FILM C | COMPARATIVE EXAMPLE 2 DIE-BONDING FILM D |
|---|---|---|---|---|
| TENSILE STORAGE ELASTIC MODULUS (MPa) | 12 | 10 | 21 | 7 |

The invention claimed is:

1. A thermosetting die-bonding film used when manufacturing a semiconductor device, comprising
    15 to 30% by weight of a thermoplastic resin component and 60 to 70% by weight of a thermosetting resin component as main components, wherein
    a surface free energy before heat curing is 37 mJ/m$^2$ or more and less than 40 mJ/m$^2$.

2. The thermosetting die-bonding film according to claim 1, which has a tensile storage modulus of 10 MPa or more at 250° C. after the film is thermally set.

3. The thermosetting die-bonding film according to claim 1, wherein a glass transition point of the die-bonding film after heat curing is 175° C. or more.

4. The thermosetting die-bonding film according to claim 1, wherein a coefficient of water absorption after heat curing by heating when left in an atmosphere at 85° C. and 85% RH for 168 hours is 1% by weight or less.

5. The thermosetting die-bonding film according to claim 1, which has a weight reduction ratio of 1% by weight or less after the film is heated at 250° C. for 1 hour after heated so as to be thermally set.

6. The thermosetting die-bonding film according to claim 1, wherein the thermoplastic resin component is an acrylic resin component.

7. The thermosetting die-bonding film according to claim 1, wherein the thermosetting resin component is at least any one of an epoxy resin component and a phenol resin component.

8. A dicing die-bonding film, wherein the thermosetting die bonding film according to claim 1 is laminated on a pressure-sensitive adhesive film.

9. The dicing die-bonding film according to claim 8, wherein the dicing film comprises a base material, a pressure-sensitive adhesive layer laminated on the base material via a base material-attaching surface of the pressure-sensitive adhesive layer, and the dicing die-bonding film laminated on a surface of the pressure-sensitive adhesive layer opposite to the base material-attaching surface of the pressure-sensitive adhesive layer.

10. The dicing die-bonding film according to claim 9, wherein the pressure-sensitive adhesive layer comprises an ultraviolet-curable pressure-sensitive adhesive.

11. The dicing die-bonding film according to claim 9, wherein the pressure-sensitive adhesive layer comprises an acrylic polymer.

12. The thermosetting die-bonding film according to claim 7, wherein the thermosetting resin comprises phenol resin and epoxy resin in a ratio of 0.5 to 2.0 equivalents hydroxyl groups in the phenol resin per equivalent of epoxy groups in the epoxy resin resin.

13. A method of manufacturing a semiconductor chip, comprising:
    providing the dicing die-bonding film of claim 8;
    fixing a semiconductor wafer to the dicing die-bonding film via the die bond layer;
    dicing the semiconductor wafer into semiconductor chips; and
    picking up a semiconductor chip and die bond layer attached thereto from the pressure-sensitive adhesive layer.

* * * * *

UNITED STATES PATENT AND TRADEMARK OFFICE
CERTIFICATE OF CORRECTION

PATENT NO. : 7,829,441 B2
APPLICATION NO. : 12/529211
DATED : November 9, 2010
INVENTOR(S) : Naohide Takamoto Page 1 of 1

It is certified that error appears in the above-identified patent and that said Letters Patent is hereby corrected as shown below:

At Column 2, Line 39, After "60-57342" insert --.--, therefor.

At Column 4, Line 29, please delete "wire" and insert --Wire--, therefor.

At Column 5, Line 12, please delete "unstreched," and insert --unstretched,--, therefor.

At Column 5, Line 63, please delete "cart" and insert --part--, therefor.

At Column 7, Line 2, please delete "(poly) ethyleneglycoldi" and insert --(poly)ethyleneglycoldi--, therefor.

At Column 7, Line 4-5, please delete "pentaerythritoldi(meth) acrylate" and insert -- pentaerythritoldi(meth)acrylate--, therefor.

At Column 7, Line 5, please delete "trimethylolpropanetri(meth) acrylate" and insert --trimethylolpropanetri(meth)acrylate--, therefor.

At Column 8, Line 67, please delete "phenyl)]" and insert --phenyl]--, therefor.

At Column 11, Line 67, please delete "trisglycidylisocyanurate" and insert --triglycidylisocyanurate--, therefor.

At Column 13, Line 2, please delete "80μm," insert --80μm.--, therefor.

At Column 18, Line 58, please delete "so-25" insert --SO-25--, therefor.

At Column 18, Lines 64-65, please delete "methylethyl ketone." and insert --methylethylketone.--, therefor.

At Column 20, Line 28, please delete "Rheometic" and insert --Rheometric--, therefor.

At Column 22, Line 32, in claim 12, before "resin." delete "resin".

Signed and Sealed this
Twenty-first Day of June, 2011

David J. Kappos
*Director of the United States Patent and Trademark Office*